United States Patent
Kelkar et al.

(10) Patent No.: US 6,916,688 B1
(45) Date of Patent: Jul. 12, 2005

(54) APPARATUS AND METHOD FOR A WAFER LEVEL CHIP SCALE PACKAGE HEAT SINK

(75) Inventors: Nikhil V. Kelkar, San Jose, CA (US); Jaime Bayan, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/313,434

(22) Filed: Dec. 5, 2002

(51) Int. Cl.$^7$ ............................................. H01L 21/44
(52) U.S. Cl. ...................... 438/122; 438/114; 438/465; 257/778
(58) Field of Search .................. 438/106–114, 118, 438/121, 122, 465; 257/778

(56) References Cited

U.S. PATENT DOCUMENTS

| | | | | |
|---|---|---|---|---|
| 4,620,215 A | | 10/1986 | Lee ............................. | 357/81 |
| 6,649,012 B2 | * | 11/2003 | Masayuki et al. ........ | 156/272.4 |
| 2004/0036161 A1 | * | 2/2004 | Williams et al. ............ | 257/706 |

OTHER PUBLICATIONS

Merriam–Webster's Collegiate Dictionary, 1998, Merriam–Webster, Tenth Edition, 251.*
Kelkar et al., "MicroSMD–A Wafer Level Chip Scale Package", May 2000, IEEE Transactions on Advanced Packaging, vol. 23, No. 2. p. 227–232.
Vikram et al., "Thermally enhanced flip chip packaging arrangement", U.S. Appl. No. 09/668,031, filed Sep. 21, 2000.

* cited by examiner

*Primary Examiner*—Nathan J. Flynn
*Assistant Examiner*—Leonardo Andújar
(74) *Attorney, Agent, or Firm*—Beyer Weaver & Thomas

(57) ABSTRACT

A flip chip semiconductor package with an integral heat sink is disclosed as well as a technique for creating individual heat sinks by applying a conductive layer to the back surface of a wafer containing integrated circuitry before singulation. According to one aspect of the invention, an adhesive layer is applied to the back surface of a semiconductor wafer. A layer of conductive material such as copper is then attached to the back surface of the wafer using the previously applied adhesive. The wafer is then singulated to create individual semiconductor packages with superior heat transfer properties.

13 Claims, 3 Drawing Sheets

APPARATUS AND METHOD FOR A WAFER LEVEL CHIP SCALE PACKAGE HEAT SINK

FIELD OF THE INVENTION

The present invention relates generally to integrated circuit packages, and more particularly, to heat transfer in micro surface mount devices (microSMDs).

BACKGROUND OF THE INVENTION

Micro surface mount devices (microSMDs), also known generically as "flip chips", are wafer level scale packages. Individual micro-SMD chips are first fabricated on a semiconductor wafer using standard semiconductor processing techniques. Typically, horizontal and vertical scribe lines of aluminum or some other type of conductive metal separate each microSMD chip on the wafer. Once the integrated circuitry and metallization interconnect is fabricated on the wafer, solder balls are formed on each of the chips on the wafer. The solder balls are used to later electrically and mechanically attach the microSMD chips to a substrate, such as a printed circuit board, after the chips are singulated from the wafer.

A fabricated wafer undergoes a number of steps to prepare the microSMD chips for mounting onto a printed circuit board. Initially the back surface of the wafer is ground to reduce its thickness and then coated with an epoxy material. The epoxy prevents chipping of the wafer during dicing. It also provides a surface for marking the chips with part numbers, company logos, and the like. Next the wafer is probed and each micro SMD chip is individually tested to identify operational and non-operational devices. A dicing machine then saws the wafer, along the scribe lines, to singulate the individual chips from the wafer. For more information on micro SMD packaging, see "MicroSMD—A Wafer Level Chip Scale Package", by N. Kelkar, Mathew H. Takiar and L. Nguyen, IEEE Transactions on Advanced Packaging, Special Issue on Wafer Level Packaging, pp. 227–232, Vol. 23, No. 2, May 2000.

FIG. 1 is an illustration of a current microSMD package 100, including an integrated circuit die 120 with as solder balls 130 shown on the active side of the die. An epoxy coating 110 has been applied to the inactive side of the die. This type of package has a number of disadvantages. One problem with the aforementioned microSMD package is that epoxy material coating 110 on the back surface of the micro SMD semiconductor is a relatively poor thermal conductor. As a result, the only viable heat transfer path from the package is via solder balls 130 on the front or active side of the package. This tends to limit the uses for microSMD chips to relatively slow, low density and low powered applications. Since high-powered, high-speed integrated circuits usually run "hot", microSMD chip packages have generally been a less than ideal for such applications. The use of a heat sink on a microSMD chip has been contemplated. However, attaching a heat sink to a microSMD after singulation is a difficult, tedious task that is expensive and difficult to automate.

Accordingly, an apparatus and method for a wafer level chip scale package heat sink is therefore needed.

SUMMARY OF THE INVENTION

To achieve the foregoing, and in accordance with the purpose of the present invention, a microSMD package with a layer of thermally conductive material applied to the back surface and a method for applying the conductive layer to the back surface of the wafer before singulation is disclosed. This involves the wafer-level fabrication of a plurality of microSMDs using conventional fabrication techniques onto a first or active surface of the wafer. After the wafer is fabricated, an adhesive layer is applied to the second or back surface of the wafer. In the final step, a thermally conductive material is applied to the second surface of the wafer using the adhesive. After singulation, the resulting microSMD dice each have a first surface and a second surface. The first surface includes the microSMD circuitry and a plurality of contacts formed thereon. The second surface includes the layer of adhesive material and the thermally conductive layer. During operation, the thermally conductive layer operates as a heat sink.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

While the present invention will be described with reference to a few specific embodiments, the description is illustrative of the invention and not to be construed as limiting the invention. Various modifications to the present invention can be made to the preferred embodiments by those skilled in the art without departing from the true spirit and scope of the invention as defined by the appended claims.

The present invention pertains to an apparatus and method of creating a flip chip package, such as a microSMD, with an integral heat sink, that is provided at the wafer level, before singulation. Attaching the heat sinks prior to singulation reduces the complexity and costs compared to the prior art technique of attaching heat sinks to individual semiconductor dice.

Figure 3A:
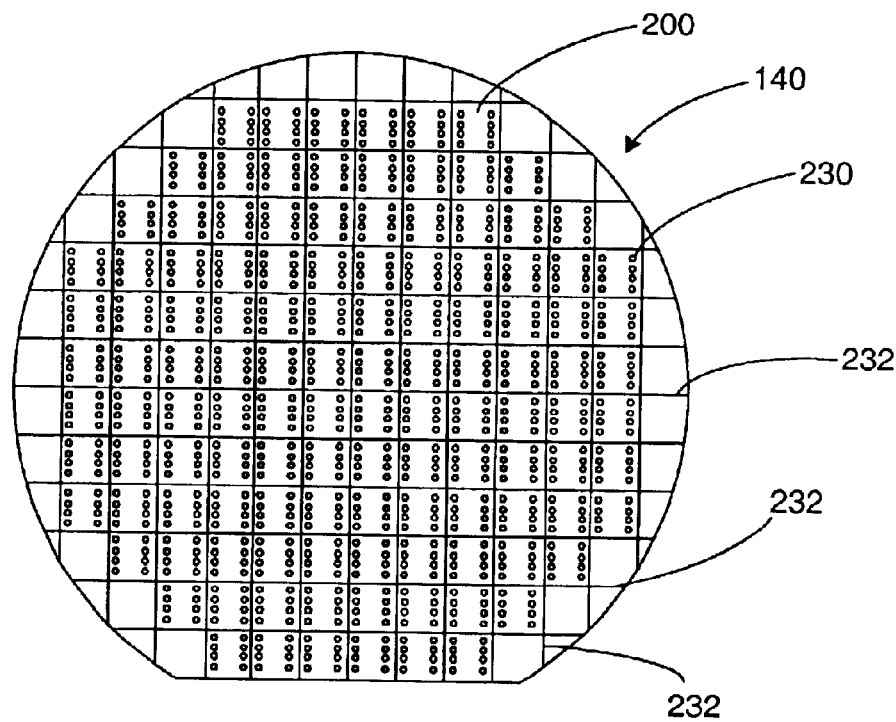
FIGS. 3A and 3B illustrate the front and back surfaces of a semiconductor wafer according to the present invention.
Figure 3B:
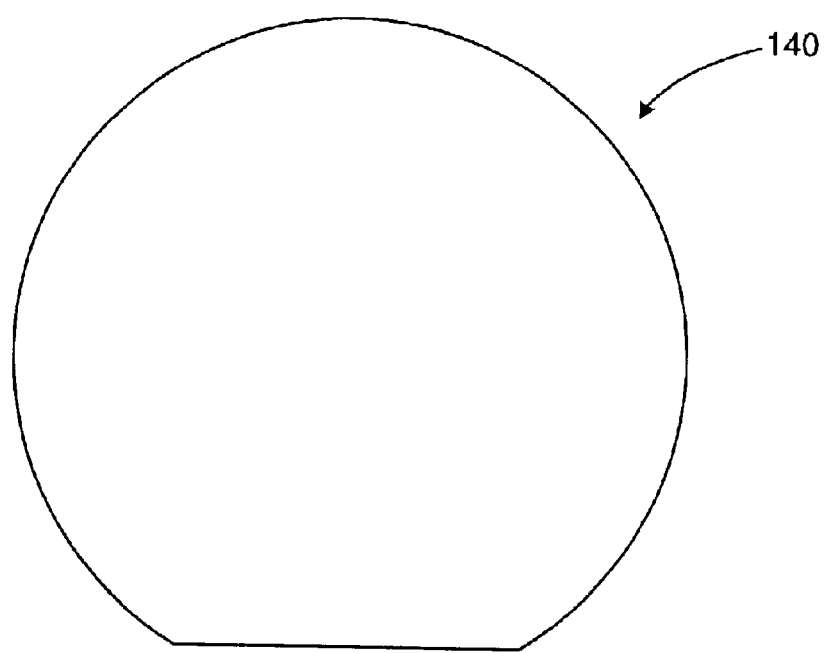

A semiconductor wafer 140 is shown in FIGS. 3A and 3B. FIG. 3A shows the front side of wafer 140 with individual undiced flip chip packages 200 each having a plurality of electrical contacts 230. FIG. 3B shows the back or inactive side of wafer 140.

Figure 1:
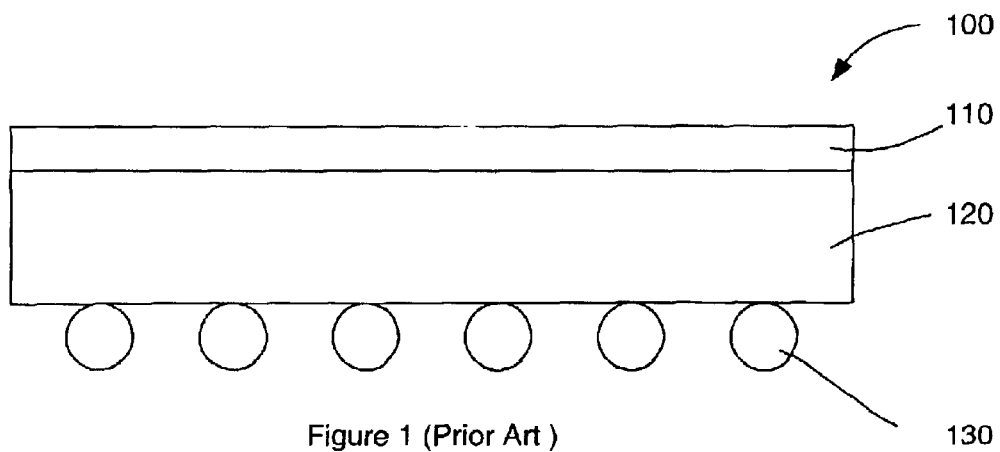
FIG. 1 illustrates a flip chip package according to the prior art.
Figure 2:
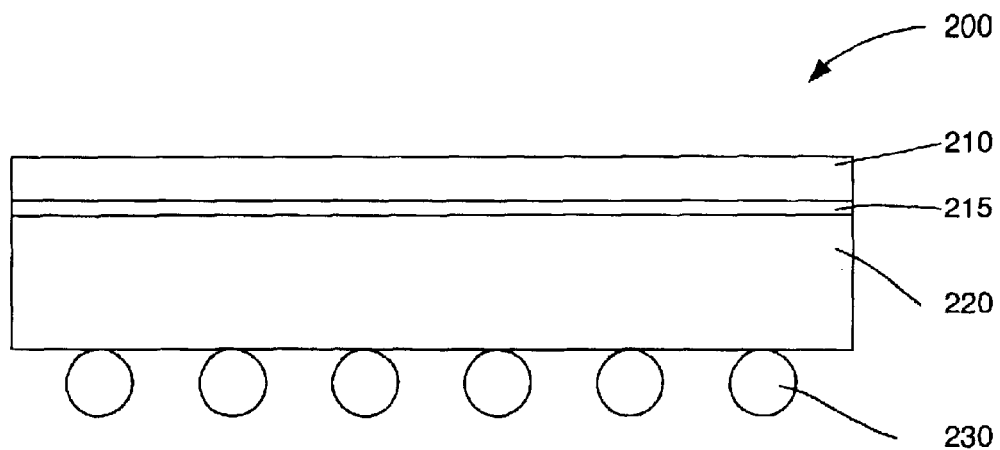
FIG. 2 illustrates a cross-sectional view of a flip chip package with a thermally conductive layer applied according to the present invention.

After the wafer 140 has been fabricated, the individual dice 200 are singulated by sawing the wafer along the scribe lines 232. For the sake of simplicity, a single flip chip 200 from wafer 140 is shown in FIG. 2. Flip chip 200 has a thermally conductive layer 210 attached to an integrated circuit die 220 using an adhesive material 215. Also shown are electrical contacts 230 on the active side of integrated circuit die 220. Thermally conductive layer 210 can be any conductive material, and adhesive material 215 can be any adhesive suitable for use in semiconductor package applications. In various embodiments of the invention, the conductive layer 210 is a metallic foil such as copper, silver, palladium, nickel, aluminum, gold or any metal which can be applied as a single layer or as an alloy or sandwich of more than one metal element. Further, adhesive material 215 can have a thickness of 10 to 100 μm and conductive layer 250 may have thickness varying between 1 and 200 μm. Semiconductor die 200 has a thickness corresponding to a standard flip chip or microSMD package, typically 50 to 1000 μm. Adhesive material 215 is a thermally conductive, partially curable (b-stageable) adhesive such as an epoxy or polymer material. Although not shown in this figure, it should be noted that all of the dice 200 on wafer 140 have conductive layer 210 and thermally conductive adhesive 215 applied.

Figure 4:
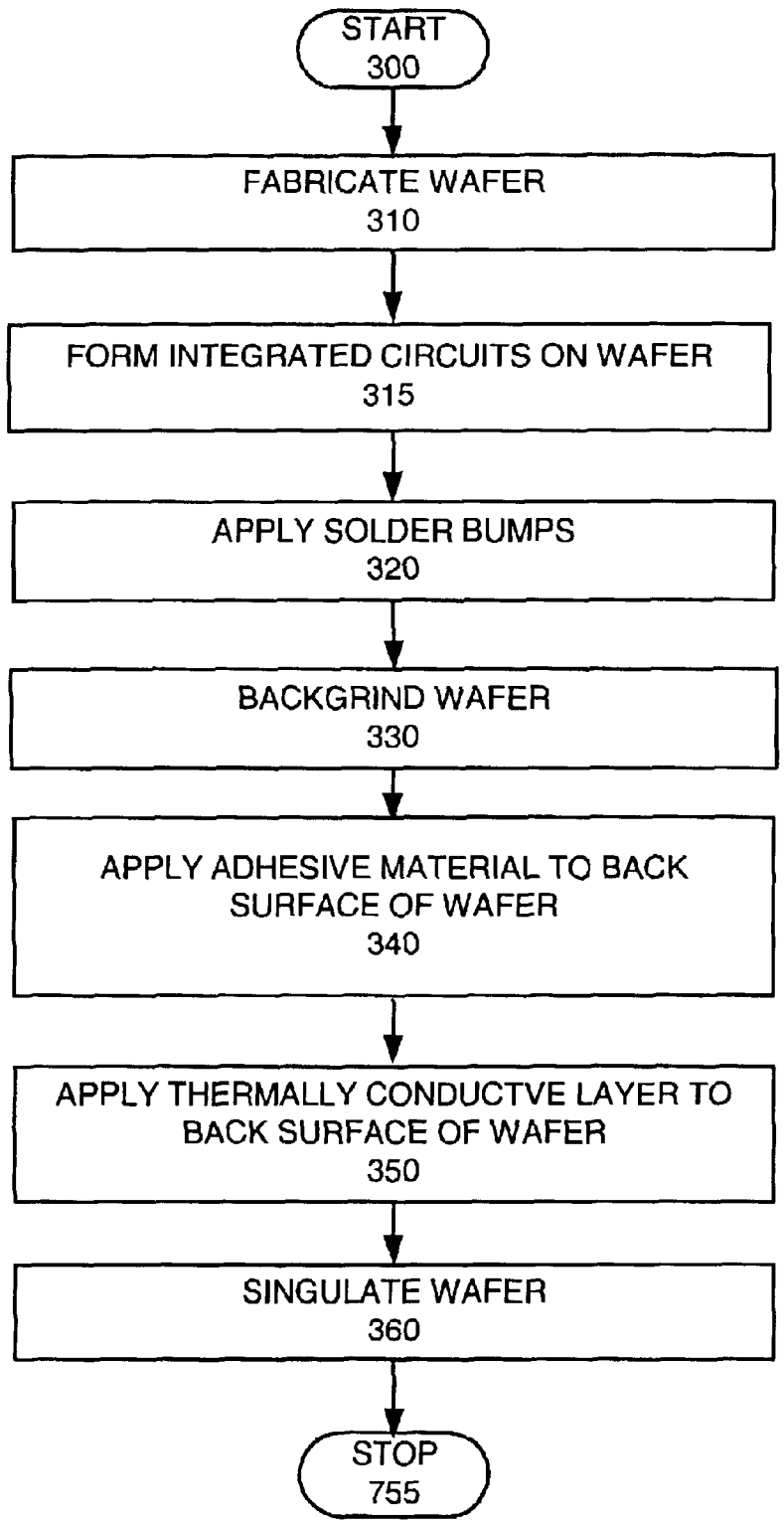
FIG. 4 illustrates process steps suitable for fabricating the flip chip package for the present invention.

FIG. 4 illustrates the process used to make wafer level flip chip package 200. Standard wafer fabrication steps, well known by persons familiar with the art are shown in steps 310, 315, and the formation of solder bumps 230 in step 320. These steps may be followed by an optional step 330 of backgrinding the wafer, which serves to reduce the thickness of the wafer and allows for the creation of a thinner package.

Following optional backgrinding step 330, adhesive material 215 is applied to the back surface of the wafer in step 340. The adhesive may be spin coated, screen or stencil printed, or laminated onto the back surface of the wafer.

Next, in step 350, the thermally conductive layer 210 is applied to the back surface of the wafer. The conductive layer may be applied by, for example, rolling on or laminating. During the lamination process, the conductive layer, for example a copper foil, is coated on one side with an adhesive. The other side of the foil is covered with a release film. During or just before attaching the foil, the release film is removed from the foil and the foil is attached to a surface using the applied adhesive. In alternate embodiments, the film may be applied using heat and pressure, where a roller supplies the pressure. It is noted that there are other ways of attaching the conductive layer and the present invention is not limited to rolling on or laminating.

If desired, a step may be added wherein the conductive layer is marked for traceability using a laser. Also, individual heat sinks corresponding to each circuit may be soldered onto the conductive layer, further improving heat transfer.

In step 360, the wafer is singulated using conventional singulation techniques, resulting in flip chip 200 as illustrated in FIG. 2.

In addition to the advantage of a superior heat transfer path through the back surface of the integrated circuit package as described above, other features of the invention have been identified. When, for instance, a copper foil is used as the thermally conductive layer, there is the additional benefit of improved solder joint reliability. The copper foil tends to cause the flip chip package to retain its shape during expansion and contraction of the package during the repeated heating and cooling cycles typical of electronic circuitry. This more consistent shape reduces the stress on the electrical connections between the package and the substrate onto which it is mounted.

Another advantage of using a metallic layer for the conductive layer is the ability to solder additional heat sinks directly to the metallic surface thus created. A standard epoxy coating on the back surface of a semiconductor package is ordinarily not suitable for soldering operations. However, the use of a metallic layer makes it possible to perform soldering operations without any additional wafer preparation.

We claim:

1. A method comprising:
    fabricating a plurality of flip chip dice on a first surface of a semiconductor wafer;
    applying solder bumps to the dice on the first surface of the wafer;
    applying an adhesive layer onto a second surface, opposite the first surface, of the semiconductor wafer; and
    applying a single, continuous, unbroken sheet of thermally conductive material across substantially the entire second surface of the wafer using the adhesive.

2. The method of claim 1, further comprising backgrinding the second surface of the wafer before the application of the adhesive layer.

3. The method of claim 1, further comprising cutting the wafer to singulate the individual dice from the wafer.

4. The method of claim 1, wherein the adhesive material is thermally conductive.

5. The method of claim 1, wherein the adhesive material is electrically insulating such as an epoxy or polymer material.

6. The method of claim 1, wherein the adhesive material is b-stageable.

7. The method of claim 1, wherein the thermally conductive material is applied by spin coating, screen or stencil printing, or lamination.

8. The method of claim 1, wherein the thermally conductive material is selected from the group consisting of copper, silver, palladium, nickel, aluminum, or a sandwich consisting of more than one element or alloy.

9. The method of claim 1, wherein the thermally conductive material is laminated or rolled onto the second surface of the wafer.

10. The method of claim 1, wherein the adhesive layer is spin coated, screen printed, or stencil printed onto the second surface of the wafer.

11. The method of claim 1, wherein the wafer is backgrinded to a thickness of 50 to 1000 μm.

12. The method of claim 1, wherein the adhesive layer is applied so that it has a thickness of 10 to 100 μm.

13. The method of claim 1, wherein the thermally conductive material has a thickness of 1 to 200 μm.

* * * * *

UNITED STATES PATENT AND TRADEMARK OFFICE
CERTIFICATE OF CORRECTION

PATENT NO.    : 6,916,688 B1
DATED         : July 12, 2005
INVENTOR(S)   : Kelkar et al.

It is certified that error appears in the above-identified patent and that said Letters Patent is hereby corrected as shown below:

Column 1,
Line 13, "wafer level scale" should read -- wafer level chip scale --.

Signed and Sealed this

Fourth Day of October , 2005

JON W. DUDAS
*Director of the United States Patent and Trademark Office*